(12) United States Patent
Borenstein et al.

(10) Patent No.: US 9,181,082 B2
(45) Date of Patent: Nov. 10, 2015

(54) MICROFLUIDIC STRUCTURES FOR BIOMEDICAL APPLICATIONS

(75) Inventors: Jeffrey T. Borenstein, Newton, MA (US); Eli J. Weinberg, Needham, MA (US); James C. Hsiao, Watertown, MA (US); Ahmad S. Khalil, Boston, MA (US); Malinda M. Tupper, Somerville, MA (US); Guillermo Garcia-Cardena, Cambridge, MA (US); Peter Mack, Boston, MA (US); Sarah L. Tao, Cambridge, MA (US)

(73) Assignees: The Charles Stark Draper Laboratory, Inc., Cambridge, MA (US); Brigham and Women's Hospital, Inc., Boston, MA (US)

( * ) Notice: Subject to any disclaimer, the term of this patent is extended or adjusted under 35 U.S.C. 154(b) by 0 days.

(21) Appl. No.: 13/608,938

(22) Filed: Sep. 10, 2012

(65) Prior Publication Data

US 2013/0004386 A1    Jan. 3, 2013

Related U.S. Application Data

(62) Division of application No. 12/234,215, filed on Sep. 19, 2008, now Pat. No. 8,266,791.

(60) Provisional application No. 60/973,529, filed on Sep. 19, 2007.

(51) Int. Cl.
*A61F 13/00* (2006.01)
*A61F 2/00* (2006.01)
(Continued)

(52) U.S. Cl.
CPC ......... *B81C 1/00119* (2013.01); *B81C 99/0085* (2013.01); *B81B 2201/058* (2013.01); *B81B 2203/0338* (2013.01); *B81B 2203/0376* (2013.01); *Y10T 29/49126* (2015.01);
(Continued)

(58) Field of Classification Search
CPC ...... B41J 2/1603; B41J 2/1626; B41J 2/1631; B41J 2/1623
USPC ............. 29/830, 846, 847, 890.1; 347/20, 40, 347/44, 45, 65; 424/422, 423, 426; 428/188, 36.9
See application file for complete search history.

(56) References Cited

U.S. PATENT DOCUMENTS 3,522,885 A    8/1970  Lavender et al.
3,684,097 A *  8/1972  Mathewson et al. ..... 210/321.72
(Continued)

FOREIGN PATENT DOCUMENTS

CN    10108454    12/2007
DE    29 52 539    7/1980
(Continued)

OTHER PUBLICATIONS

"Membranes for Oxygenation" [online]. MEMBRANA [dated May 18, 2006]. Retrieved from the Web archive on Jan. 28, 2010: <http://web.archive.org/web/20060518064326/http:/www.membrana.com/oxygenation/hexpet/center.htm>, 2 pages.
(Continued)

*Primary Examiner* — David Angwin
(74) *Attorney, Agent, or Firm* — Edward A. Gordon; Foley & Lardner LLP

(57) ABSTRACT

Microfluidic structures featuring substantially circular channels may be fabricated by embossing polymer sheets.

7 Claims, 15 Drawing Sheets

(51) Int. Cl.
B81C 1/00 (2006.01)
B81C 99/00 (2010.01)

(52) U.S. Cl.
CPC ...... Y10T29/49155 (2015.01); Y10T 29/49156 (2015.01); Y10T 29/49401 (2015.01); Y10T 156/1039 (2015.01); Y10T 428/139 (2015.01)

(56) References Cited

U.S. PATENT DOCUMENTS

| | | | |
|---|---|---|---|
| 3,839,204 A * | 10/1974 | Ingenito et al. | 210/181 |
| 3,892,533 A * | 7/1975 | Freedman et al. | 422/48 |
| 3,894,954 A | 7/1975 | Serur | |
| 3,927,981 A | 12/1975 | Viannay et al. | |
| 3,977,976 A | 8/1976 | Spaan et al. | |
| 4,008,047 A | 2/1977 | Petersen | |
| 4,124,478 A | 11/1978 | Tsien et al. | |
| 4,176,069 A | 11/1979 | Metz et al. | |
| 4,191,182 A | 3/1980 | Popovich et al. | |
| 4,229,290 A * | 10/1980 | Raj | 210/646 |
| 4,304,010 A * | 12/1981 | Mano | 623/1.46 |
| 4,306,318 A | 12/1981 | Mano et al. | |
| 4,323,455 A | 4/1982 | Tanaka et al. | |
| 4,332,035 A | 6/1982 | Mano | |
| 4,355,426 A | 10/1982 | MacGregor | |
| 4,444,662 A * | 4/1984 | Conover | 210/500.36 |
| 4,474,851 A * | 10/1984 | Urry | 428/373 |
| 4,550,447 A * | 11/1985 | Seiler et al. | 623/1.32 |
| 4,636,309 A * | 1/1987 | Bellhouse | 210/321.72 |
| 4,666,668 A | 5/1987 | Lidorenko et al. | |
| 4,715,955 A * | 12/1987 | Friedman | 210/346 |
| 5,034,188 A * | 7/1991 | Nakanishi et al. | 422/46 |
| 5,043,073 A * | 8/1991 | Brunner et al. | 210/646 |
| 5,110,548 A * | 5/1992 | Montevecchi | 422/48 |
| 5,162,101 A * | 11/1992 | Cosentino et al. | 422/46 |
| 5,225,161 A * | 7/1993 | Mathewson et al. | 422/46 |
| 5,230,693 A * | 7/1993 | Williams et al. | 623/1.41 |
| 5,263,924 A * | 11/1993 | Mathewson | 604/6.14 |
| 5,277,176 A * | 1/1994 | Habashi et al. | 128/200.24 |
| 5,316,724 A * | 5/1994 | Mathewson et al. | 422/48 |
| 5,443,950 A * | 8/1995 | Naughton et al. | 435/1.1 |
| 5,518,680 A * | 5/1996 | Cima et al. | 264/401 |
| 5,601,727 A | 2/1997 | Bormann et al. | |
| 5,626,759 A * | 5/1997 | Krantz et al. | 210/645 |
| 5,651,900 A * | 7/1997 | Keller et al. | 216/56 |
| 5,695,717 A * | 12/1997 | Polaschegg et al. | 422/48 |
| 5,770,417 A | 6/1998 | Vacanti et al. | |
| 5,938,923 A * | 8/1999 | Tu et al. | 210/490 |
| 6,039,897 A * | 3/2000 | Lochhead et al. | 264/1.24 |
| 6,099,557 A * | 8/2000 | Schmitt | 623/1.1 |
| 6,136,212 A * | 10/2000 | Mastrangelo et al. | 216/56 |
| 6,139,574 A * | 10/2000 | Vacanti et al. | 623/1.44 |
| 6,143,293 A * | 11/2000 | Weiss et al. | 424/93.7 |
| 6,245,566 B1 * | 6/2001 | Gearhart et al. | 435/384 |
| 6,258,271 B1 * | 7/2001 | Jitariouk et al. | 210/500.23 |
| 6,328,789 B1 * | 12/2001 | Spranger | 96/179 |
| 6,454,924 B2 * | 9/2002 | Jedrzejewski et al. | 204/601 |
| 6,455,311 B1 | 9/2002 | Vacanti | |
| 6,468,312 B1 | 10/2002 | Rennebeck et al. | |
| 6,517,571 B1 | 2/2003 | Brauker et al. | |
| 6,572,642 B2 | 6/2003 | Rinaldi et al. | |
| 6,586,246 B1 | 7/2003 | Yoon et al. | |
| 6,637,437 B1 * | 10/2003 | Hungerford et al. | 128/898 |
| 6,649,058 B1 | 11/2003 | Jitariouk et al. | |
| 6,726,711 B1 * | 4/2004 | Langenbach et al. | 623/23.68 |
| 6,729,352 B2 * | 5/2004 | O'Connor et al. | 137/827 |
| 6,730,516 B2 | 5/2004 | Jedrzejewski et al. | |
| 6,743,636 B2 * | 6/2004 | Chung et al. | 436/100 |
| 6,752,966 B1 | 6/2004 | Chazan | |
| 6,793,677 B2 | 9/2004 | Ferree | |
| 6,814,753 B2 * | 11/2004 | Schmitt | 623/1.44 |
| 6,868,605 B2 * | 3/2005 | Maeng et al. | 29/890.1 |
| 6,878,271 B2 * | 4/2005 | Gilbert et al. | 210/321.61 |
| 6,893,666 B2 | 5/2005 | Spievack | |
| 6,900,021 B1 * | 5/2005 | Harrison et al. | 435/7.21 |
| 6,918,886 B1 * | 7/2005 | Baurmeister | 604/6.09 |
| 6,932,951 B1 | 8/2005 | Losey et al. | 422/211 |
| 6,939,377 B2 * | 9/2005 | Jayaraman et al. | 623/1.46 |
| 6,942,879 B2 * | 9/2005 | Humes | 424/529 |
| 6,946,143 B2 * | 9/2005 | Kim et al. | 424/443 |
| 6,977,223 B2 * | 12/2005 | George et al. | 438/676 |
| 6,986,735 B2 * | 1/2006 | Abraham et al. | 600/36 |
| 6,991,628 B2 | 1/2006 | Vito et al. | |
| 6,993,406 B1 * | 1/2006 | Cesarano et al. | 700/119 |
| 7,087,431 B2 * | 8/2006 | Wu et al. | 435/395 |
| 7,094,379 B2 * | 8/2006 | Fouillet et al. | 422/504 |
| 7,122,371 B1 * | 10/2006 | Ma | 435/297.1 |
| 7,143,900 B2 * | 12/2006 | Hernandez | 210/498 |
| 7,166,464 B2 * | 1/2007 | McAllister et al. | 435/395 |
| 7,174,282 B2 * | 2/2007 | Hollister et al. | 703/2 |
| 7,175,658 B1 * | 2/2007 | Flugelman | 623/1.41 |
| 7,201,917 B2 * | 4/2007 | Malaviya et al. | 424/423 |
| 7,244,272 B2 * | 7/2007 | Dubson et al. | 623/1.44 |
| 7,309,540 B2 * | 12/2007 | Wang | 429/457 |
| 7,316,822 B2 * | 1/2008 | Binette et al. | 424/549 |
| 7,323,143 B2 * | 1/2008 | Anderson et al. | 422/502 |
| 7,348,175 B2 * | 3/2008 | Vilendrer et al. | 435/284.1 |
| 7,354,702 B2 * | 4/2008 | Dai et al. | 435/1.3 |
| 7,371,400 B2 * | 5/2008 | Borenstein et al. | 424/423 |
| 7,371,567 B2 * | 5/2008 | Galavotti | 435/297.4 |
| 7,413,712 B2 * | 8/2008 | Liu et al. | 422/504 |
| 7,416,884 B2 * | 8/2008 | Gemmiti et al. | 435/293.1 |
| 7,445,926 B2 * | 11/2008 | Mathies et al. | 435/288.5 |
| 7,507,380 B2 * | 3/2009 | Chang et al. | 422/129 |
| 7,507,579 B2 * | 3/2009 | Boccazzi et al. | 435/297.5 |
| 7,517,453 B2 * | 4/2009 | Bitensky et al. | 210/321.6 |
| 7,533,463 B2 * | 5/2009 | Conta et al. | 29/890.1 |
| 7,569,127 B1 * | 8/2009 | Cho | 204/403.01 |
| 7,597,677 B2 * | 10/2009 | Gura et al. | 604/5.04 |
| 7,670,797 B2 * | 3/2010 | Vacanti et al. | 435/30 |
| 7,727,399 B2 * | 6/2010 | Leonard et al. | 210/643 |
| 7,759,113 B2 * | 7/2010 | Vacanti et al. | 435/284.1 |
| 7,776,021 B2 * | 8/2010 | Borenstein et al. | 604/406 |
| 7,790,028 B1 * | 9/2010 | Weinberg et al. | 210/321.6 |
| 7,837,379 B2 * | 11/2010 | Fiering et al. | 366/181.5 |
| 7,960,166 B2 * | 6/2011 | Vacanti et al. | 435/284.1 |
| 7,985,336 B2 * | 7/2011 | Weinberg et al. | 210/321.6 |
| 8,097,456 B2 * | 1/2012 | Borenstein et al. | 435/395 |
| 8,147,562 B2 * | 4/2012 | Vacanti et al. | 623/23.72 |
| 8,173,361 B2 * | 5/2012 | Vacanti et al. | 435/4 |
| 8,266,791 B2 * | 9/2012 | Borenstein et al. | 29/830 |
| 8,557,582 B2 * | 10/2013 | Moraes et al. | 435/401 |
| 2002/0012616 A1 * | 1/2002 | Zhou et al. | 422/130 |
| 2002/0052571 A1 * | 5/2002 | Fazio | 604/5.01 |
| 2002/0098472 A1 * | 7/2002 | Erlach et al. | 435/4 |
| 2002/0166585 A1 * | 11/2002 | O'Connor et al. | 137/87.01 |
| 2002/0173033 A1 * | 11/2002 | Hammerick et al. | 435/305.2 |
| 2002/0182241 A1 | 12/2002 | Borenstein et al. | |
| 2003/0003575 A1 | 1/2003 | Vacanti et al. | |
| 2003/0049839 A1 | 3/2003 | Romero-Ortega et al. | |
| 2003/0080060 A1 | 5/2003 | Gulvin | |
| 2003/0119184 A1 * | 6/2003 | Humes | 435/369 |
| 2003/0121841 A1 * | 7/2003 | Harttig et al. | 210/321.84 |
| 2003/0180711 A1 * | 9/2003 | Turner et al. | 435/4 |
| 2003/0231981 A1 * | 12/2003 | Johnson et al. | 422/44 |
| 2004/0057869 A1 * | 3/2004 | Dingley | 422/48 |
| 2004/0077261 A1 | 4/2004 | Jensen et al. | |
| 2004/0089357 A1 | 5/2004 | Dube et al. | |
| 2004/0147032 A1 * | 7/2004 | Martin et al. | 436/69 |
| 2004/0149688 A1 * | 8/2004 | Fuchs et al. | 216/56 |
| 2004/0168982 A1 * | 9/2004 | Bitensky et al. | 210/649 |
| 2005/0008675 A1 * | 1/2005 | Bhatia et al. | 424/426 |
| 2005/0014064 A1 * | 1/2005 | Matsubara | 429/180 |
| 2005/0020557 A1 * | 1/2005 | Johnson et al. | 514/183 |
| 2005/0037471 A1 * | 2/2005 | Liu et al. | 435/91.2 |
| 2005/0048519 A1 * | 3/2005 | Chien et al. | 435/6 |
| 2005/0129580 A1 * | 6/2005 | Swinehart et al. | 422/100 |
| 2005/0148064 A1 * | 7/2005 | Yamakawa et al. | 435/287.2 |
| 2005/0238687 A1 * | 10/2005 | Humes | 424/423 |
| 2006/0019326 A1 * | 1/2006 | Vacanti et al. | 435/18 |
| 2006/0136182 A1 * | 6/2006 | Vacanti et al. | 703/11 |
| 2006/0154361 A1 * | 7/2006 | Wikswo et al. | 435/289.1 |
| 2006/0195179 A1 * | 8/2006 | Sun et al. | 623/1.54 |
| 2006/0234207 A1 * | 10/2006 | Khaldoyanidi | 435/4 |

(56) References Cited

U.S. PATENT DOCUMENTS

| | | | |
|---|---|---|---|
| 2006/0275270 A1* | 12/2006 | Warren et al. | 424/93.7 |
| 2006/0278580 A1* | 12/2006 | Striemer et al. | 210/650 |
| 2007/0048727 A1* | 3/2007 | Shuler et al. | 435/1.2 |
| 2007/0086918 A1* | 4/2007 | Hartley et al. | 422/73 |
| 2007/0128244 A1* | 6/2007 | Smyth | 424/423 |
| 2007/0139451 A1* | 6/2007 | Somasiri et al. | 346/138 |
| 2007/0183935 A1* | 8/2007 | Clemmens et al. | 422/100 |
| 2007/0217964 A1* | 9/2007 | Johnson et al. | 422/130 |
| 2007/0231783 A1* | 10/2007 | Prabhakarpandian et al. | 435/4 |
| 2007/0266801 A1* | 11/2007 | Khademhosseini et al. | 73/863.91 |
| 2007/0281353 A1 | 12/2007 | Vacanti et al. | |
| 2007/0293932 A1 | 12/2007 | Zilla et al. | |
| 2008/0026464 A1* | 1/2008 | Borenstein et al. | 435/395 |
| 2008/0051696 A1* | 2/2008 | Curtin et al. | 604/29 |
| 2008/0093298 A1 | 4/2008 | Browning et al. | |
| 2008/0166795 A1* | 7/2008 | Shuler et al. | 435/288.7 |
| 2009/0004737 A1* | 1/2009 | Borenstein et al. | 435/395 |
| 2009/0044619 A1* | 2/2009 | Fiering et al. | 73/202 |
| 2009/0060797 A1* | 3/2009 | Mathies et al. | 422/103 |
| 2009/0181200 A1 | 7/2009 | Borenstein et al. | |
| 2009/0211977 A1* | 8/2009 | Miller | 210/646 |
| 2009/0234322 A1* | 9/2009 | Fischer | 604/512 |
| 2009/0234332 A1* | 9/2009 | Borenstein et al. | 604/891.1 |
| 2009/0316972 A1* | 12/2009 | Borenstein et al. | 382/131 |
| 2010/0022936 A1 | 1/2010 | Gura et al. | |
| 2010/0100027 A1 | 4/2010 | Schilthuizen et al. | |
| 2010/0170796 A1* | 7/2010 | Bhatia et al. | 204/453 |
| 2010/0198131 A1* | 8/2010 | Leonard et al. | 604/5.04 |
| 2010/0240086 A1* | 9/2010 | Kashanin et al. | 435/29 |
| 2010/0326914 A1 | 12/2010 | Drost et al. | |
| 2011/0024346 A1 | 2/2011 | Weinberg et al. | |
| 2011/0082563 A1 | 4/2011 | Charest et al. | |
| 2011/0105982 A1 | 5/2011 | Leonard et al. | |
| 2011/0155667 A1* | 6/2011 | Charest et al. | 210/651 |
| 2011/0158847 A1* | 6/2011 | Charest et al. | 422/45 |
| 2011/0186165 A1* | 8/2011 | Borenstein et al. | 137/833 |
| 2011/0250585 A1* | 10/2011 | Ingber et al. | 435/5 |
| 2011/0290113 A1* | 12/2011 | Borenstein et al. | 95/54 |

FOREIGN PATENT DOCUMENTS

| | | |
|---|---|---|
| DE | 100 00 823 | 7/2001 |
| DE | 102008 045 621 | 3/2010 |
| EP | 0 416 92 | 12/1981 |
| EP | 0 246 675 | 11/1987 |
| GB | 1 408 562 | 10/1975 |
| JP | 53-134777 | 11/1978 |
| JP | 56-141835 | 11/1981 |
| JP | 06-237992 | 8/1994 |
| WO | WO-99/48541 | 9/1999 |
| WO | WO-99/60952 | 12/1999 |
| WO | WO-00/38758 | 7/2000 |
| WO | WO-02/076529 | 10/2002 |
| WO | WO-03/082145 | 10/2003 |
| WO | WO-2005/034624 | 4/2005 |
| WO | WO-2005/069966 | 8/2005 |
| WO | WO-2005/123950 | 12/2005 |
| WO | WO-2006/042079 A1 | 4/2006 |
| WO | WO-2006/052551 A2 | 5/2006 |
| WO | WO-2006/062745 | 6/2006 |
| WO | WO-2006/063758 | 6/2006 |
| WO | WO-2007/038572 A2 | 4/2007 |
| WO | WO-2007/070660 | 6/2007 |
| WO | WO-2007/119073 | 10/2007 |
| WO | WO-2008/100559 | 8/2008 |
| WO | WO-2008/127732 A2 | 10/2008 |
| WO | WO-2009/029801 A2 | 3/2009 |
| WO | WO-2009/042671 | 4/2009 |
| WO | WO-2009/082535 | 7/2009 |

OTHER PUBLICATIONS

"Polyimide membrane for use as artificial lung material," Biomedical Materials (Nov. 1994), excerpt [online]. HighBeam Research, a part of The Gale Group, Inc. [retrieved Jan. 28, 2010]. Retrieved from the Internet: <http://www.highbeam.com/doc/1G1-45103565.html>, 3 pages.

Becker H et al. Polymer Microfabrication Methods for Microfluidic Analytical Applications, Electrophoresis, Wily Interscience, vol. 21, Jan. 1, 2000, pp. 12-26.

Borenstein, J. et al., "Living 3-Dimensional Microfabricated Constructs for the Replacement of Vital Organ Function," Proceedings of the 12th International Conference on Solid-State Sensors and Actuators, and Microsystems (Transducers '03), Boston, MA, pp. 1754-1757 (Jun. 8-12, 2003).

Camp, J. et al., "Fabrication of a multiple-diameter branched network of microvascular channels with semi-circular cross-sections using xenon difluoride etching," Biomed Microdevices vol. 10, pp. 179-186,(2008).

Charest, J. et al., "Numerical Modeling, Microfabrication, and Cell Adhesion Testing of a Tissue Engineered Loop of Henle Device," presented at the Society for Biomaterials Translational Biomaterial Research Symposium, Atlanta, GA (2008).

Diaz-Quijada, G. et al., "A Simple Approach to Micropatterning and Surface Modification of Poly(dimethylsiloxane)," Langmuir, vol. 20, pp. 9607-9611 (2004).

Drug-induced vascular injury—a quest for biomarkers: Expert Working Group on Drug-Induced Vascular Injury, Toxicology and Applied Pharmacology vol. 203, pp. 62-87 (2005).

Ex parte Quayle, U.S. Appl. No. 12/234,215, mailed Feb. 16, 2012.

Examination Report issued Jan. 18, 2013 in European Patent Application No. 08832581.6.

Fischer, S., et al., "The Novalung iLA membrane ventilator: technical aspects" (Sep. 2006) [online]. CTSNet [retrieved Jan. 27, 2010]. Retrieved from the Internet: <http://www.ctsnet.org/sections/portals/thoracic/newtechnology/article-9.html>, 3 pages.

Giselbrecht, S. et al., "3D tissue culture substrates produced by microthermoforming of preprocessed polymer films," Biomed Microdevices, vol. 8(3): pp. 191-199 (2006).

Heckele, M. et al., "Review on micro molding of thermoplastic polymers," J. Micromech. Microeng, vol. 14: pp. R1-R14 (2004).

Higgins, J. M., et al., "Sickle cell vasoocclusion and rescue in a microfluidic device," PNAS, vol. 104, No. 51. pp. 20496-20500 (Dec. 2007).

Hu, X. et al., "Tissue Engineering of Nearly Transparent Corneal Stroma," Tissue Engineering, vol. 11, No. 11-12, pp. 1710-1717 (2005).

International Preliminary Report on Patentability issued Mar. 24, 2010 in PCT Application No. PCT/US2008/077026.

International Search Report and Written Opinion dated Sep. 4, 2009 for International Application No. PCT/US2008/077026, International Filing Date Sep. 19, 2008.

International Search Report mailed Sep. 4, 2009 in PCT Application No. PCT/US2008/077026.

Kaazempur-Mofrad, M., "A MEMS-Based Renal Replacement System," Solid-State Sensor, Actuator and Microsystems Workshop, Hilton Head Island, South Carolina (Jun. 2004).

Keegan, M. et al., "Biodegradable Microspheres with Enhanced Capacity for Covalently Bound Surface Ligands," 2004 American Chemical Society, Macromolecules, vol. 37, pp. 9779-9784 (2004).

LaVan, D. et al., "Simple, Three-Dimensional Microfabrication of Electrodeposited Structures," in Angew. Chem. Int. Ed. pp. 1262-1265 (2003).

Leclerc, E. et al., "Microfluidic PDMS (Polydimethylsiloxane) Bioreactor for Large-Scale Culture of Hepatocytes," Biotechnology Progress, vol. 20, issue 3, pp. 750-755 (Sep. 2008), abstract [online]. John Wiley & Sons, Inc. [retrieved Feb. 1, 2010]. Retrieved from the Internet: <http://www3.interscience.wiley.com/journal/121400565/abstract?CRETRY=1&SRETRY=0>, 2 pages.

Maiellaro, K., "Microfabricated Silicon Microchannels for Cell Rheology Study," A Thesis presented to the Graduate School of the University of Florida in Partial Fulfillment of the Requirements for the degree of Master of Engineering (2003).

Mengoli, A., "Creation and working of an oxygenator, industrial view," ITBM-RBM, vol. 27, supp. 1, pp. S14-S15 (Dec. 2006), abstract [online]. Elsevier, B. V. [retrieved Jan. 28, 2010]. Retrieved

(56) References Cited

OTHER PUBLICATIONS from the Internet: <http://www.sciencedirect.com/science?_ob=ArticleURL&_udi=B7GHY-4NW57RK4&_user=10&_coverDate=12%2F31%2F2006&_alid=1189015349&_rdoc=1&_fmt=high&_orig=search&_cdi=20191&_sort=r&_docanchor=&view=c&_ct=1&_acct=C000050221&_version=1&_urlVersion=0&_userid=10&md5=6edbac25c04fa.

Notice of Allowance in U.S. Appl. No. 12/234,215 dated May 21, 2012.

Partial International Search Report dated May 19, 2009 for International Application No. PCT/US2008/077026, International Filing Date Sep. 19, 2008.

Prichard, H. et al., "Adult Adipose-Derived Stem Cell Attachment to Biomaterials," Biomaterials, vol. 28(6): pp. 936-946 (2007).

St. Peter, W., "Introduction: Chronic Kidney Disease: A Burgeoning Health Epidemic," Journal of Managed Care Pharmacy, vol. 13, No. 9, pp. S2-S5 (Dec. 2007).

Walboomers, X. et al., "Growth behavior of fibroblasts on microgrooved polystyrene," Biomaterials, vol. 19(20): pp. 1861-1868 (1998).

Weinberg, E. et al., "Concept and computational design for a bioartificial nephron-on-a-chip," The International Journal of Artificial Organs, vol. 31, No. 6, pp. 508-514 (2008).

Weinberg, E. et al., "Design and Fabrication of a Constant Shear Microfluidic Network for Tissue Engineering," Materials Research Society, vol. 820: pp. W9.4.1-W9.4.6 (2004).

Yasuhiko, I. et al., "A nonthrombogenic gas-permeable membrane composed of a phospholipid polymer skin film adhered to a polyethylene porous membrane," Biomaterials, vol. 23, issue 16, pp. 3421-3427 (Aug. 2002), abstract [online]. Elsevier, B. V. [retrieved Jan. 28, 2010]. Retrieved from the Internet: <http://www.sciencedirect.com/science?_ob=ArticleURL&_udi=B6TWB-458WW7H9&_user=10&_coverDate=08%2F31%2F2002&_alid=1189200655&_rdoc=1&_fmt=high&_orig=search&_cdi=5558&_sort=r&_docanchor=.

Yi et al. Moldless Electroplating for Cylindrical Microchannel Fabrication, Electrochemistry Communication, Elsevier, vol. 7, No. 9, Sep. 1, 2005, pp. 913-917.

Chinese Office Action dated Apr. 9, 2013, Application No. 201080052259.0.

International Search Report dated Oct. 8, 2011, International application No. PCT/US2010/051461, International filing date May 10, 2010.

Office Action issued Nov. 20, 2013 in Chinese Patent Application No. 201080052259.0 (6 pages).

US Office Action in U.S. Appl. No. 12/398,311 DTD Mar. 12, 2012.
US Office Action in U.S. Appl. No. 12/573,561 DTD Apr. 30, 2012.
US Office Action in U.S. Appl. No. 12/573,561 DTD Nov. 28, 2012.
US Office Action in U.S. Appl. No. 12/573,561 DTD Feb. 20, 2014.

Aran et al. "Irreversible, Direct Bonding of Nanoporous Polymer Membranes to PDMS or Glass Microdevices," Lab Chip, vol. 10, pp. 548-552, 2010.

Burgess et al. "Towards Microfabricated Biohybrid Artificial Lung Modules for Chronic Respiratory Support," Biomed Microdevices, vol. 11, pp. 117-127, 2009.

Examination Report in AU Pat. App. No. 2010303620 dated May 26, 2014.

Hoganson et al. "Branched Vascular Network Architecture: A New Approach to Lung Assist Device Technology," J. Thorac. Cardiovasc. Surg., Nov. 2010; 140(5):990-5. Epub Jun. 29, 2010, Abstract.

International Search Report and Written Opinion dated Aug. 26, 2011 for International application No. PCT/US2011/038148, International Filing Date May 26, 2011.

International Search Report and Written Opinion dated Aug. 5, 2011 for International Application No. PCT/US2010/051461, International Filing Date Oct. 5, 2010.

International Search Report and Written Opinion dated Dec. 27, 2010 for International Application No. PCT/US2010/054602, International Filing Date Oct. 29, 2010.

International Search Report and Written Opinion dated May 2, 2011 for International application No. PCT/US2010/062537, International Filing Date Dec. 30, 2010.

Kniazeva et al. "A Microfluidic Respiratory Assist Device with High Gas Permeance for Artificial Lung Applications," Biomed Microdevices, 9 pages, Published online Nov. 27, 2010.

Kung et al. "Microchannel Technologies for Artificial Lungs: (2) Screen-filled Wide Rectangular Channels," ASAIO J., vol. 54(4), pp. 383-389, 2008.

Mehta et al. "Quantitative Measurement and Control of Oxygen Levels in Microfluidic Poly(dimethylsiloxane) Bioreactors During Cell Culture," Biomed Microdevices, vol. 9, pp. 123-134, 2007.

Rejection Decision in Chinese Patent Application No. 201080052259.0 dated Jun. 26, 2014.

US Office Action in U.S. Appl. No. 12/573,561 dated Jul. 31, 2014.
US Office Action in U.S. Appl. No. 12/398,311 DTD May 14, 2014.

Zhang, "The Permeability Characteristics of Silicone Rubber," SAMPE Fall Technical Conference, "Global Advances in Materials and Process Engineering", proceedings, Coatings and Sealants Section, Nov. 6-9, 2006, Dallas, TX, 10 pages.

\* cited by examiner

FIG. 9A                    FIG. 9B

MICROFLUIDIC STRUCTURES FOR BIOMEDICAL APPLICATIONS

CROSS-REFERENCE TO RELATED APPLICATION

The present application is a divisional of U.S. patent application Ser. No. 12/234,215, entitled "Method of Fabricating Microfluidic Structures for Biomedical Applications," filed on Sep. 19, 2008, which in turn claims priority to and the benefit of U.S. Provisional Patent Application No. 60/973,529, which was filed on Sep. 19, 2007, each of which are incorporated herein by reference in their entirety.

TECHNICAL FIELD

In various embodiments, the invention relates to microfluidic structures for biomedical applications and, more particularly, to microfluidic constructs with a vascular-like geometry for in vitro, in vivo, and ex vivo applications in biomedical and clinical research and therapy.

BACKGROUND

Existing structures for blood flow, such as hollow fibers, tubing, and machined structures are typically produced using conventional macroscale chemical and mechanical processing techniques. Microfluidic devices are typically fabricated using conventional lithographic or etching techniques combined with replica molding. The methods for generating these structures that attempt to mimic vascular networks typically suffer from difficulties in reproducing, on the microscale, the specific and vitally important features of blood vessels. Methods using hollow fibers or other tubular structures and machined or stereolithographically formed elements for therapeutic devices, such as renal dialysis cartridges, liver assist devices, and pulmonary support devices, are typically limited in terms of the minimum diameter achievable. In addition, vessel bifurcations in tube and fiber-based constructs typically contain sharp angles due to limitations in the assembly processes. These limitations also introduce sudden changes in diameter at vessel diameter expansions and contractions. The sharp and sudden non-physiologic features lead to disturbed flow and poor control over key parameters, such as wall shear stress, leading to increased levels of inflammation and clotting and difficulties in seeding cells along the walls of the channels.

Microfluidic devices have addressed some of the shortfalls associated with fiber, tubing, and machining or solid freeform techniques. Principally, microfluidics has enabled a dramatic reduction in minimum feature size and simplification of the assembly processes. However, existing microfluidic fabrication techniques typically do not enable smooth transitions at bifurcations or vessel diameter changes, because the processes used to build the microfluidic master molds often result in rectangular geometries and do not enable tapered transition regions.

Conventional techniques for microfluidics include the use of lithographically-formed master molds (conventional positive or negative photoresist or SU-8 epoxy resin) that produce rectangular or nearly-rectangular sidewalls. Techniques have been reported that produce curvature in the sidewalls using JSR photoresist or other photoresists combined with baking processes to slump the sidewalls. These processes are not well-controlled and do not produce an inverse-circular geometry needed for replica molding. In addition, these processes do not enable smooth transitions at bifurcations or smooth changes in vessel diameter because they are essentially layer-by-layer deposition and exposure techniques, and therefore by nature they result in step changes in geometry.

Etching processes such as plasma etching or wet etching typically have the same limitations as do the lithographic techniques. Deep Reactive Ion Etching (DRIE) techniques are highly anisotropic, and, when modified to produce graded sidewalls, still produce straight walls and sharp corners. Isotropic RIE techniques and isotropic wet etching techniques typically have very slow etch rates and are not well-controlled for longer etch times and arbitrary geometries. In addition, isotropic etching does not maintain a circular aspect ratio for deeper etching processes.

SUMMARY OF THE INVENTION

In various embodiments, the present invention utilizes a microfluidic process sequence in which master molds are formed and then polymer sheets are replica molded from the master molds and joined together to form vascular networks. Large-scale three-dimensional structures may be produced by layering the microfluidic network sheets together with fluidic manifold connections between the layers. One difference between the exemplary methods described herein and the former methods is the ability, using the methods described herein, to form smooth, vascular-like geometries of microchannel networks in three dimensions. In some embodiments, this is enabled by the nature of the master mold formation process, as well as the related assembly methods for the fluidic manifold joining layers together. In certain embodiments of the present invention, master fabrication techniques result in truly semicircular geometries, as well as smooth transitions at vessel diameter changes and at vessel bifurcations. Manifold structuring and assembly techniques capable of providing similar smooth flow transitions are used to complete the three-dimensional fluidic network.

Exemplary commercial applications for embodiments of the present invention include the use of the microvascular network structures as tools for basic research in cardiovascular, cancer, and organ-specific disease biology, drug discovery, and drug safety testing. In addition, embodiments of the present invention find commercial application in organ assist devices for liver, kidney, lung, and other vascularized organs and tissues, as well as in organ replacement structures.

Exemplary advantages of the methods and devices described herein include the ability to construct smooth transitions at vessel bifurcations and at vessel diameter changes in a manner similar to healthy physiologic structures, which are scalable to large three-dimensional structures, as well as the ability to produce substantially cylindrical microchannel geometries. Other advantages are that embodiments of the present invention are much more physiologically realistic in structure. Former methods are forced to choose between employing large-diameter cylindrical tubes or smaller diameter microfluidic structures with approximately rectangular geometries, while embodiments of the present invention enable substantially cylindrical geometries at any size scale. In addition, former structures include sharp angles, dead spaces, and sudden expansions/contractions between vessels at bifurcations and at dimensional changes found in microvascular networks. Embodiments of the present invention enable smooth transitions at bifurcations and at changes in diameter, minimal dead volume, and smooth flow. Thus, disturbed flow conditions associated with thrombus formation are minimized or avoided, plaque formation and inflammatory response are minimized or avoided, and substantially uniform wall shear stress at every point along the inner circumference of the lumen is achieved.

In one aspect, embodiments of the invention feature a method for fabricating a microfluidic structure having a channel with substantially circular cross section. Herein, a cross section is understood to be perpendicular to a longitudinal axis of the channel, and the point where the longitudinal axis intersects with the cross section is considered to be the center point of the cross section. The channel need not be straight, and, consequently, different portions of the channel may have different longitudinal axes. Further, in various embodiments, "substantially circular" cross sections are meant to denominate cross sections whose deviation from perfect circularity is characterized by a ratio of the largest diameter to the smallest diameter of less than 1.3, preferably less than 1.1, even more preferably less than 1.03. Diameters are defined with respect to the center point of the cross section.

In one embodiment, the method includes providing a patterned wafer that includes at least one exposed electrically conductive region and at least one exposed electrically insulating region; and electroplating an inverse channel portion with substantially semicircular cross section onto the wafer, thereby forming a first master mold. This first master mold may then be employed to emboss, either directly or via two transfer molds, a channel portion in a polymer sheet. Subsequently, the polymer sheet may be aligned and bonded with a second embossed polymer sheet that contains a corresponding channel portion, i.e., a channel portion that is substantially mirror symmetric to the channel portion in the first sheet, so that a channel with substantially circular cross section is defined between the two sheets. In some embodiments, the same master mold may be used to emboss both sheets, and in other embodiments, a second master mold, fabricated in a similar manner as the first master mold, may be used. In one embodiment, channels are seeded with cells. In certain embodiments, the channel is characterized by a gradually changing diameter, and/or by a smooth and gradual bifurcation into two channels.

The electrically conductive region may contain gold, chromium, titanium, tungsten, platinum, copper, silver, aluminum, or a combination thereof. The electrically insulating region may contain silicon dioxide and/or silicon nitride. The patterned wafer may further include a substrate, e.g., containing or consisting essentially of silicon. In some embodiments, the electrically conductive region, which may be continuous or discontinuous, is deposited on the substrate, and the electrically insulating region(s) are deposited, at least in part, on the electrically conductive region. In alternative embodiments, the electrically insulating region is deposited on the substrate, and the electrically conductive region(s) are, at least partially, deposited thereon. The electroplated inverse channel portion may comprise a metal selected from the group consisting of copper, gold, nickel, and/or silver.

In certain embodiments, the method of producing the microfluidic structure may be repeated to form additional microfluidic structures, and the resulting plurality of microfluidic structures may be stacked in a way that it defines a front surface containing the outlets of the channels. The method may further be repeated to form a microfluidic header, which may be coupled to the front surface and aligned with the channel outlets so as to fluidically couple the microfluidic structures together.

In another aspect, embodiments of the invention feature a microfluidic structure, which includes a polymer scaffold that defines a first channel therein. At least a portion of the channel is characterized by a substantially circular cross section and a diameter less than 300 µm. In some embodiments, the ratio of any first diameter of the channel to any second diameter that intersects with the first (i.e., lies in the same cross section) is less than 1.3, preferably less than 1.1. In one embodiment, the channel is further characterized by a gradually changing diameter. In some embodiments, the first channel bifurcates into second and third channels, and the passages between the first and the second channels as well as between the first and the third channels are smooth and gradual. In certain embodiments, cells are seeded within the channel(s).

In yet another aspect, embodiments of the invention feature a microfluidic device. The device includes a plurality of microfluidic structures and a microfluidic header coupling the structures together. Each microfluidic structure includes a polymer scaffold defining at least one channel. The structures are stacked to form a stacked structure that defines a front surface containing outlets of the channels. The microfluidic header is coupled to the front surface and aligned with the outlets so as to fluidically couple the structures together. In some embodiments, the microfluidic header includes a plurality of polymer scaffolds, each defining a network of channels. In certain embodiments, cells are seeded within the channels. At least a portion of one channel may be characterized by a substantially circular cross section and a diameter less than 300 µm.

In still another aspect, embodiments of the invention provide a method for fabricating a microfluidic structure that includes: providing a patterned wafer; isotropically etching the wafer with xenon difluoride to form a master mold with an inverse channel portion having a substantially semicircular cross section; embossing the master mold into a transfer mold; embossing the transfer mold into a polymer sheet; and aligning and bonding the polymer sheet with a substantially mirror symmetric second polymer sheet to define a channel with substantially circular cross section between the sheets. In certain embodiments, the diameter of the inverse channel changes gradually from a first to a second diameter.

BRIEF DESCRIPTION OF THE DRAWINGS

The foregoing and other objects, aspects, features, and advantages of the invention will become more apparent and may be better understood by referring to the following description taken in conjunction with the accompanying drawings, in which:

FIG. 9A is an exploded view of a flow distribution manifold (header) ready for assembly with a vertical stack of flow networks in accordance with one embodiment of the invention;

FIG. 9B illustrates the flow distribution manifold of FIG. 9A after assembly;

DESCRIPTION

Described herein are various embodiments of microfluidic structures and three-dimensional microfluidic devices for biomedical applications. Computational models for microvascular networks, precise microfluidic fabrication technologies, and an endothelial cell model system may be integrated to clearly establish functional cell phenotype in a true three-dimensional construct. This technology may be used to manufacture devices for in-vitro applications, including: fundamental vascular biology research; investigations of clotting, inflammation, plaque formation, and other pathologic states of vasculature; and drug discovery and drug safety testing. Moreover, the technology may be translated into precision three-dimensional biodegradable scaffolds integrated with co-culture models and matrix materials suitable for tissue engineering applications, such as the development of wearable or implantable devices that incorporate vascular access and a microcirculation.

In accordance with various embodiments of the invention, microfluidic structures containing substantially cylindrical microchannels of vascular-like geometry, with diameters ranging from approximately 5 microns to more than 10 mm and with lengths ranging from approximately 100 microns to several centimeters, may be fabricated. Aspects of the vascular-like geometry may include smooth microchannel walls, substantially circular channel cross-sections, continuous changes in channel diameters, and gradual transitions between channels at bifurcations. These features allow for smooth flow paths throughout the entirety of the channel network.

Microfluidic structures may be constructed using scaffolding materials compatible with the seeding, expansion, and sustainment of functional vascular cells, including endothelial cells and smooth muscle cells. In various embodiments of the invention, methods for fabricating such microfluidic scaffolds involve fabricating master molds that mimic the geometry of microvascular networks and embossing these master molds into a well-established substrate for tissue culture. Certain methods may produce cylindrical geometries suitable for microvessels at diameters as small as tens of microns, distinguishing them from other common microfluidic fabrication techniques such as SU-8 photolithography or Deep Reactive Ion Etching.

Figure 1:
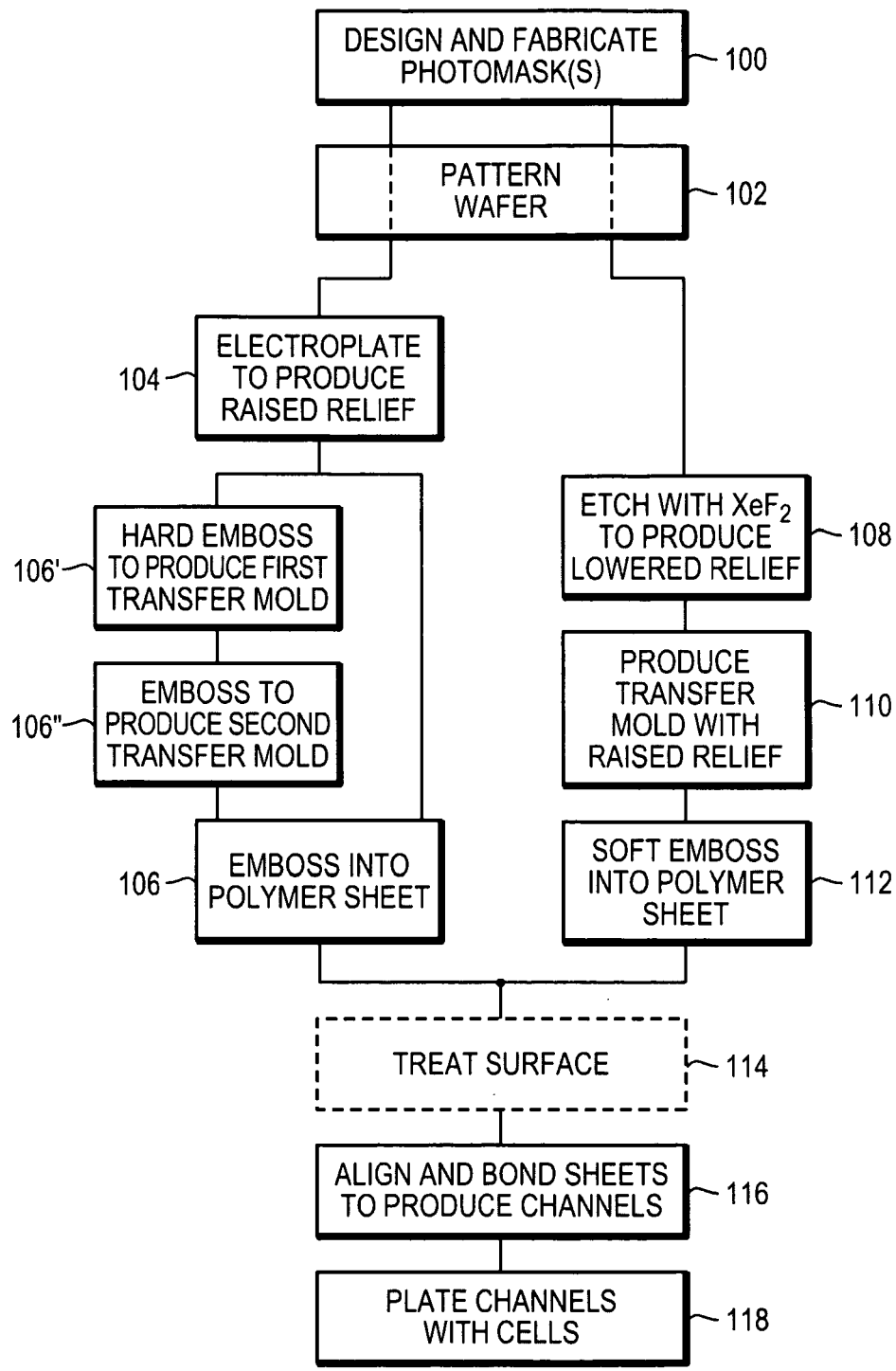
FIG. 1 is a flow diagram illustrating methods of fabricating microfluidic devices in accordance with various embodiments of the invention.

The flow chart depicted in FIG. 1 provides an overview of methods for fabricating microfluidic structures according to various embodiments. These methods begin with the design and fabrication of one or more photomasks defining structures corresponding to the desired channel network (step 100). The mask layout may be created in a computer drawing, and may then be converted into a Computer-Aided Design (CAD) layout, e.g., using a software package such as Tanner L-Edit. CAD layouts provide a format suitable for conversion into a photomask generated by electron-beam lithography or a similar technique.

In step 102, the photomask is used to pattern a substrate, typically a silicon wafer. Patterning may generally involve several lithography, chemical development, etching, baking, and lift-off steps. The particular process sequence involved depends on the ensuing master mold fabrication steps, and is explained in detail further below in the context of specific methods.

Figures 2A, 2B:
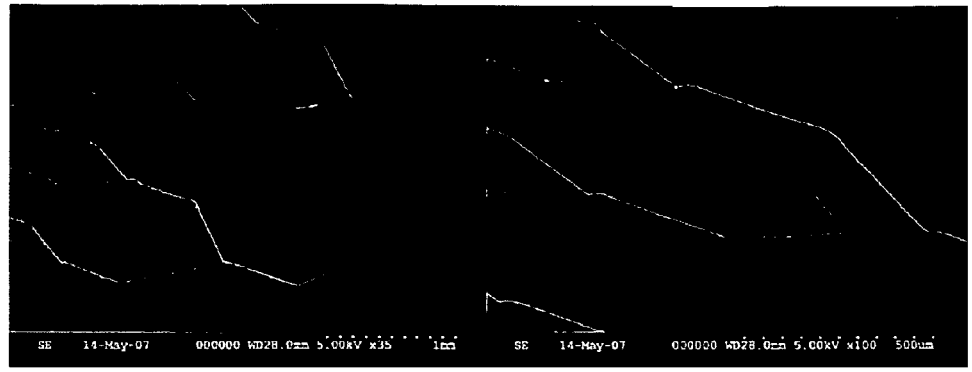
FIG. 2A is a scanning electron microscopy (SEM) image of one embodiment of a copper electroplated mold on a silicon wafer showing four levels of smooth vessel bifurcations.
FIG. 2B is a higher magnification SEM image of the copper electroplated mold on the silicon wafer of FIG. 2A showing an inverse half-cylindrical geometry of the electroplated mold that may be used to emboss half-cylindrical channels in a polymer sheet.

In some embodiments, illustrated by the left-hand branch of the flow chart depicted in FIG. 1, the patterned wafer contains electrically conductive regions and electrically insulating regions, and serves as the seed structure for electroplating. During the electroplating step 104, the patterned wafer is coupled to the cathode of an electric circuit, and immersed in an electrolytic bath that also contains a metallic anode. The anode material, which may be, for instance, copper, nickel, gold, or silver, dissolves and deposits on the exposed, electrically charged metallic regions of the patterned wafer. Thereby, a half-relief for subsequent hard embossing is formed. A portion of an exemplary electroplated master mold with eight generations of bifurcated microchannels having semi-circular cross-sections is shown in the SEM images of FIGS. 2A and 2B. In particular, FIG. 2A shows five generations of channels, and FIG. 2B shows a close-up of the bifurcation points between the channels. The bifurcation points show smooth transitions that allow non-disturbed flow through those regions.

Figures 3A, 3B:
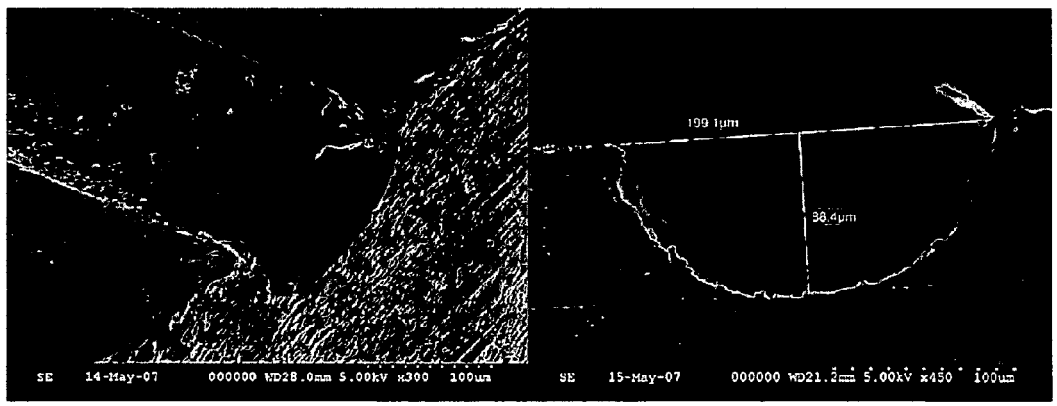
FIG. 3A is an SEM image illustrating a top view of one embodiment of a polystyrene film hard embossed using a copper electroplated mold.
FIG. 3B is an SEM image illustrating a side view of the polystyrene film depicted in FIG. 3A.

The electroplated master mold may be used directly to hard emboss substantially half-cylindrical features into a polymer sheet, such as a polycarbonate or polystyrene sheet (step 106). For cell cultures of numerous cell types, tissue culture grade polystyrene provides a well-established platform. In an exemplary hard embossing technique that is robust, reproducible, and high-precision, polystyrene sheets from Plaskolite, Inc. (040" Clear UVF Styrene), cut to the appropriate size, are hard embossed using a metal-plated silicon mold as described above. More specifically, the silicon mold and polystyrene sheet are sandwiched between two pieces of Kapton film (Fralock Inc.) in an embossing apparatus, which allows for precise control of the temperature and pressure. The temperature of the apparatus may be raised to 130° C., and the chamber evacuated, causing the piston of the embosser to exert a pressure of 25 inches Hg on the mold and polystyrene substrate. The temperature may be maintained at 130° C. for 15 minutes, then the apparatus cooled to approximately 40° C. The mold and substrate may then be removed from the embosser and separated to form a free-standing polystyrene device with rounded microchannels. Deeper channels that allow for incorporation of flexible tubing may be created by attaching metal tubing at the ends of the microchannels. An example of an embossed polystyrene part is shown in FIGS. 3A and 3B.

In an alternative embodiment, the master mold may be used to emboss a transfer polymer mold (step 106'), resulting in a lowered relief, and the transfer polymer mold used to emboss a second transfer polymer mold (step 106"), resulting in a raised relief. Finally, the second transfer polymer mold may be used to emboss the polystyrene sheet (step 106). This method is advantageous in that it avoids the repeated use of the electroplated master molds, which can be fragile and delaminate over time and temperature cycles. A transfer mold is often more robust since it is one solid piece, rather than a composite of a substrate with an electroplated metal pattern on top. Suitable materials for both the first and second transfer mold are hard polymers that will withstand temperature and maintain precise features over time and temperature cycling, such as, e.g., polyurethane, polystyrene, or polypropylene.

Alternatively, and with reference to the right-hand branch of the flow chart depicted in FIG. 1, the patterned wafer may contain surface regions where the silicon is exposed, and regions protected by silicon oxide. Typically, a silicon wafer is coated with a silicon oxide layer, which is subsequently patterned lithographically. This wafer may be etched by xenon difluoride gas ($XeF_2$), which is highly selective to etching silicon, but not silicon oxide, and which removes silicon atoms in an isotropic fashion, i.e., etches vertically and laterally at the same rate (step 108). Thereby, trenches with substantially semicircular cross sections are produced in the silicon wafer. Trenches with changing diameters may be achieved by patterning the photoresist layer with features of gradually changing widths, such as tapered features.

Figures 4A, 4B, 4C:
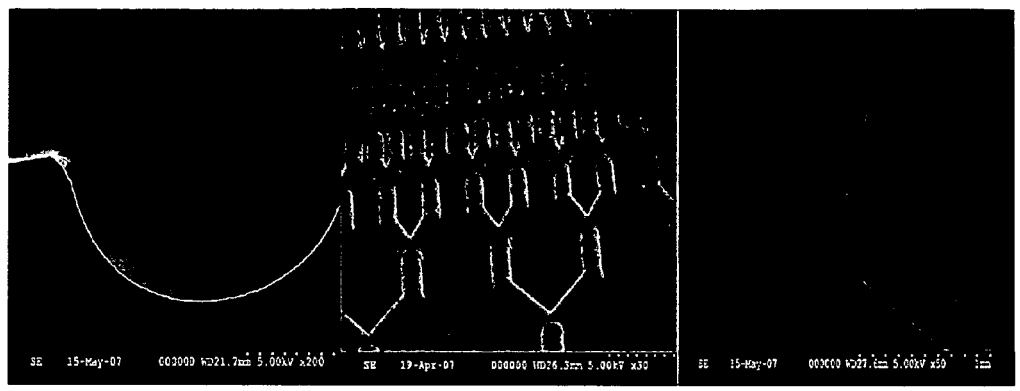
FIG. 4A illustrates a XeF$_2$-etched silicon tool for fabrication of a polystyrene microfluidic device in accordance with one embodiment of the invention.
FIG. 4B illustrates a PDMS transfer mold for fabrication of a polystyrene microfluidic device in accordance with one embodiment of the invention.
FIG. 4C illustrates an embossed polystyrene part for fabrication of a polystyrene microfluidic device in accordance with one embodiment of the invention.

The pattern etched into the silicon wafer may be transferred to a master polymer mold, such as, for example, a PDMS mold or a polyurethane mold, thereby producing rounded raised structures similar to those of the electroplated mold (step 110). The master polymer mold may then be used to soft-emboss a polymer sheet, such as a polystyrene sheet, thereby creating rounded microchannel portions (step 112). In this case, the polystyrene sheet may be heated to a higher temperature (150° C.) to allow it to form more readily around the soft polymer mold. In various embodiments, producing a polymer copy of the etched silicon wafer is preferable over using the etched silicon wafer directly since polymers may exhibit material properties advantageous for biomedical applications, including transparency, low material cost, biocompatibility, and, in some cases, biodegradability. An exemplary silicon wafer, polymer (e.g., PDMS) transfer mold, and embossed polystyrene part created from this process are depicted in FIGS. 4A, 4B, and 4C, respectively.

Figures 5A, 5B:
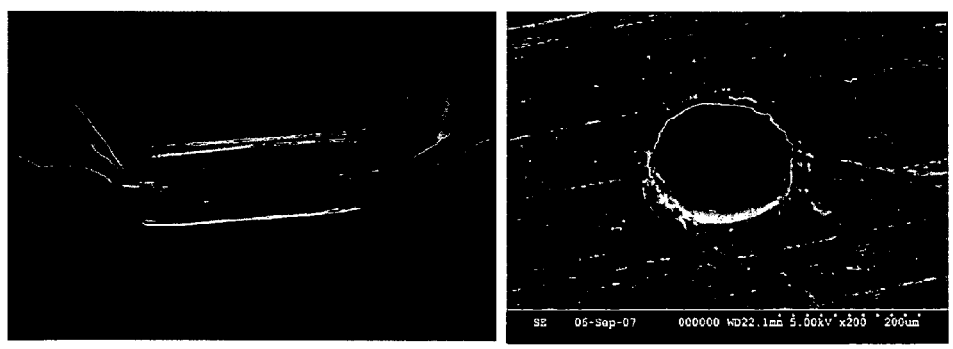
FIG. 5A is a photo of a sealed polystyrene microfluidic device with integrated tubing in accordance with one embodiment of the invention.
FIG. 5B is an SEM photo of a channel cross section of the device of FIG. 5A.

In an optional step 114, the channel portions in the polystyrene surface may be treated chemically, e.g., with an oxygen plasma using a Technics Microstripper with a setting of 100 mW and 100 mTorr $O_2$ pressure for one minute, so that they become more hydrophilic and friendly to cell adhesion. Two corresponding embossed, treated surfaces may then be placed in contact, and the channels portions aligned with the aid of an optical microscope such as to form substantially cylindrical channels (step 116). Flexible silastic tubing (Dow Corning Inc.) may be cut and placed in the deeper channels designed for tubing connections. The two sheets may be thermally bonded in the embossing apparatus at 90° C. for 30 minutes. The flexible tubing may also be sealed in place during bonding, creating a seamless interface for injection of cells. An exemplary microfluidic structure, fabricated by hard embossing an electroplated master mold into two polystyrene sheets, is depicted in FIG. 5A. The close-up of FIG. 5B shows the circular cross section of a channel outlet. Since the structure depicted in FIGS. 5A and 5B exhibits substantial mirror symmetry, the same master mold may be used to emboss both polymer sheets. In general, however, the fabrication of two corresponding sheets whose channel portions can be lined up requires two master molds with substantially mirrored reliefs.

In step 118, the microfluidic structure may be plated with cells of various types, e.g., with endothelial cells. Tissue culture grade polystyrene, which serves as the industry standard for cell and tissue arrays for high-throughput screening and other laboratory applications, is highly suitable for establishing a robust functional phenotype.

A. Electroplating Methods for Fabricating Master Molds

Figure 6A:
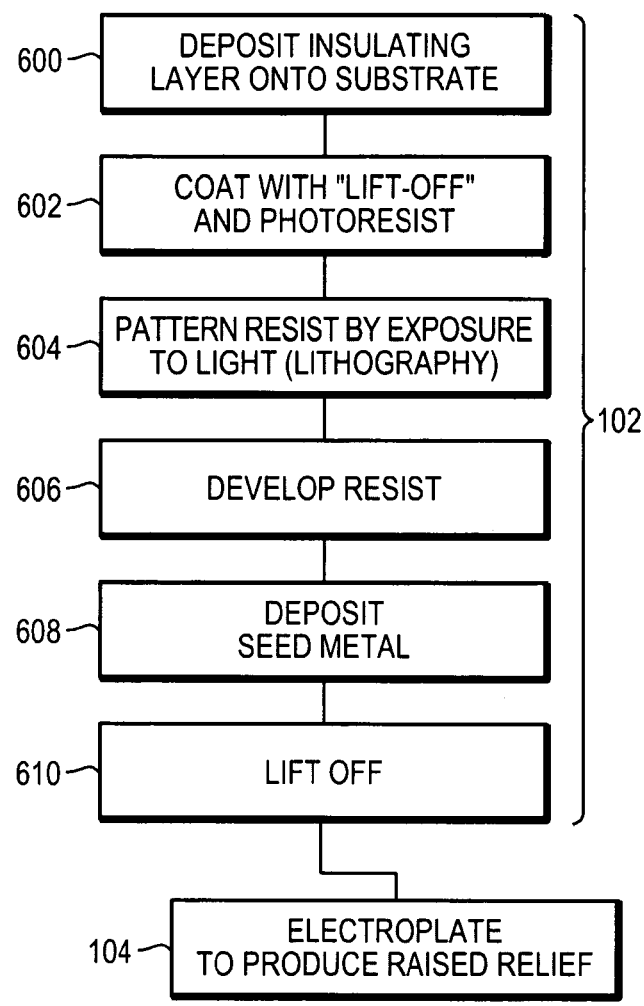
FIG. 6A is a flow diagram for fabricating a master mold according to a patterned gap electroplating process in accordance with one embodiment of the invention.
Figure 6B:
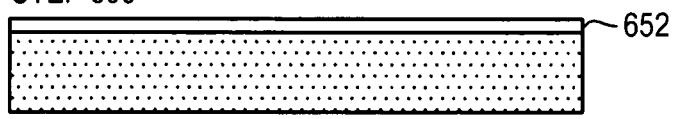
FIG. 6B is a schematic illustration of an exemplary copper electroplating process in accordance with the method of FIG. 6A for microchannel networks with varying diameters, in which the seed metal is patterned so that subsequent electroplating contacts open new seed metal areas after a time delay, thereby controlling the feature height and width.
Figure 6B:
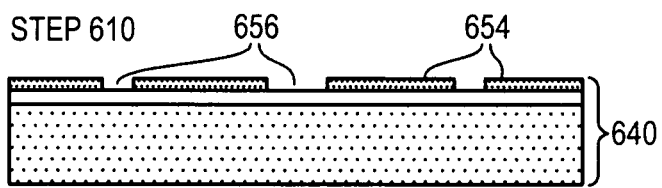
Figure 6B:
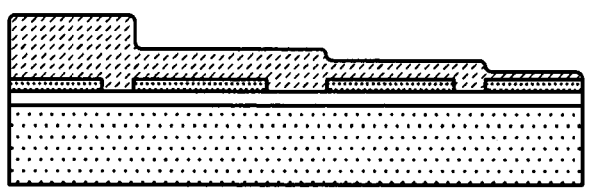
Figure 6C:
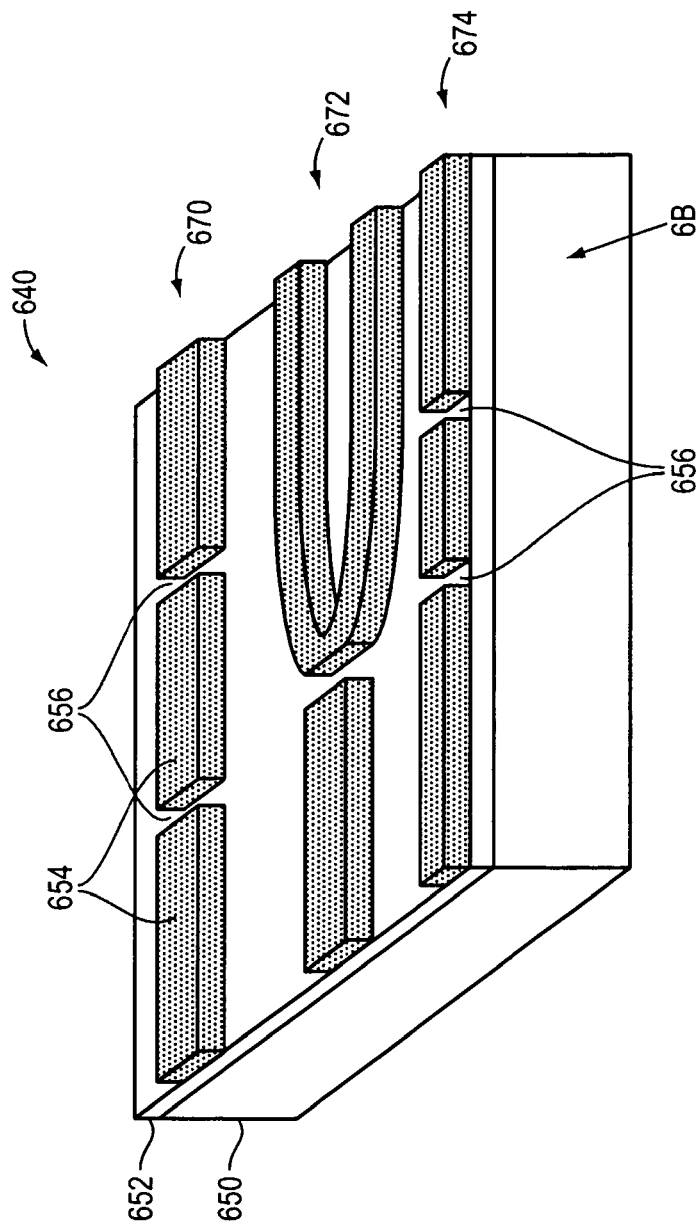
FIG. 6C is a perspective view of an exemplary structure fabricated according to the method of FIG. 6A.

Various electroplating methods may be employed to fabricate master molds with inverse channel portions that feature substantially semicircular cross sections, gradually varying diameters, and/or smooth bifurcations. FIGS. 6A-6C illustrate a metal electroplating process known as a "patterned gap" process, which is capable of producing silicon master molds with a range of microchannel diameters and smooth flow transitions at bifurcations and between successive generations of channels. As detailed in the flow diagram of FIG. 6A and the schematic of FIG. 6B, the process begins with the deposition of a blanket layer of electrically insulating material onto a clean silicon wafer or other substrate (step 600). For example, a thin silicon oxide or silicon nitride layer may be produced by thermal oxidation. This layer may be between approximately 0.5 and 1 μm thick.

In the subsequent steps, the insulating layer may be patterned according to the desired microfluidic structure, utilizing the photomask fabricated in step 100. In one embodiment, the insulator-coated wafer is covered with a specialized 'lift-off' resist (e.g., Microchem, Corp. LOR series) and the photoresist AZ1518 (step 602). The photomask is then placed onto the wafer, e.g., using a contact aligner (e.g., Karl Suss MA-6), for the subsequent lithography step 604. After illumination, the photoresist and lift-off resist may be developed using diluted AZ400K and MF319, respectively (step 606). In step 608, the seed metal for electroplating is deposited. Suitable seed metals include chrome, gold, titanium, tungsten, and platinum, as well as combinations thereof, such as chrome-gold (e.g., 1000A Cr/3000A Au) or titanium-tungsten. In some embodiments, the seed metal layer includes an adhesion layer of chrome, titanium, or tungsten-titanium, and a top metal layer of gold, platinum, or copper. The seed metal may be deposited in a sputterer (e.g., Mill Lane DC Magnetron Sputterer) or in an evaporator (e.g., Denton E-Beam Evaporator). Lift-off (step 610) may be achieved by ultrasonically agitating the wafer in a solvent. The resulting structure 640, depicted in FIGS. 6B and 6C, includes a substrate 650, a continuous insulating later 652, and metallic regions 654 on top of the insulating layer 652. In regions 656 where the metal has been lifted off, the insulating layer 652 is exposed. The patterned wafer 640 is ready for metal electroplating.

With reference to FIGS. 1 and 6A, copper electroplating, at step 104, may then be achieved by submerging the wafer in a commercially-available bath solution (Technic, Inc. Copper Bath RTU) and applying proper electrical current within the bath. By optimizing the application of the current (e.g., 70 mA measured with a Fluke volt meter), a reliable copper growth rate of 15 μm/hr may be achieved. Alternatively, other metals such as, for example, nickel, gold, and silver may be electroplated.

In one embodiment, the metal electroplating begins immediately in regions for which the metal pattern is directly connected to the anode, but is delayed in other regions by the presence of the gaps breaking the connection between the anode and the exposed seed metal. The length of these gaps governs the delay time prior to the start of electroplating the metal onto the next level of microchannels with the network design. For instance, a gap of 100 microns introduces a time delay such that the largest ridges are 100 microns taller than the next level structures. By varying the gaps in a systematic fashion, an entire range of microvessel diameters may be achieved on embossed layers. For example, FIG. 6C illustrates three exemplary metal patterns 670, 672, and 674. Patterns 670 and 674 each comprise three straight metal portions, whereas pattern 672 comprises a straight metal portion, and two branching metal portions. If the leftmost metal portions are connected to the anode, metal deposits on these portions first. Once a certain thickness of the deposited layer is reached, the deposited metal forms an electrical connection with the next portions to the right, and metal deposits thereafter in both regions. As a result, the diameter of the deposited structure changes at the location of the gap. Patterns 670 and 674 both result in an inverse channel whose diameter changes twice; pattern 672 results in an inverse channel that branches into two channels of smaller diameter. Patterned gap electroplating produces rounded structures, which, when embossed into a polymer sheet, achieves rounded channel portions. The exact shape of the channel cross section depends on the plated material, the dimensions of the seed metal structures, and electroplating parameters. In some embodiments, cross sections resemble trapezoids, in others, they approximate semicircles.

Figure 7A:
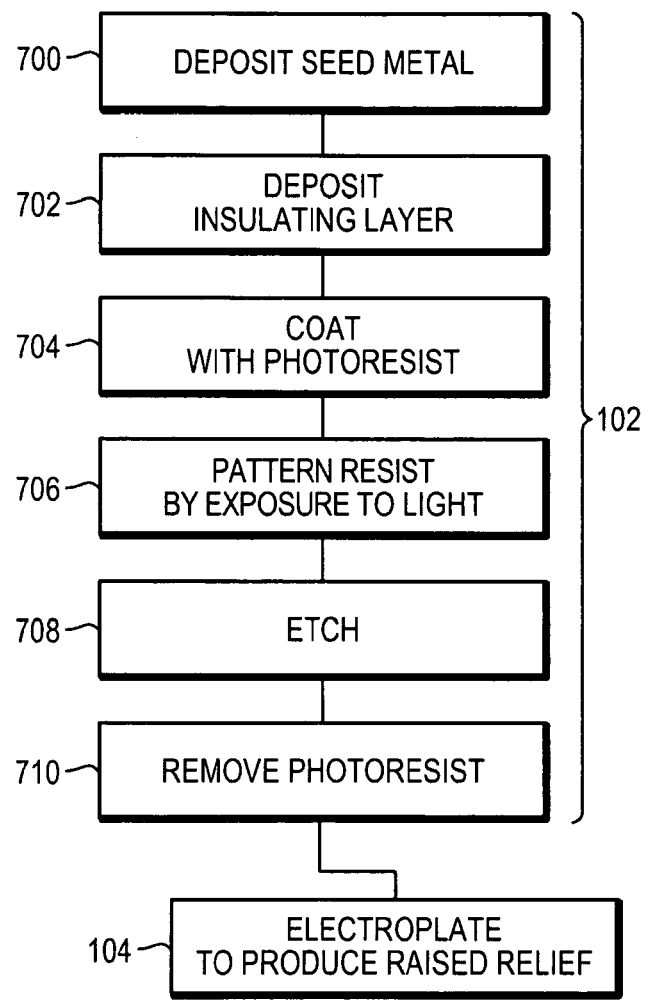
FIG. 7A is a flow diagram of a method for fabricating a master mold according to a buried electrode electroplating process in accordance with one embodiment of the invention.
Figure 7B:
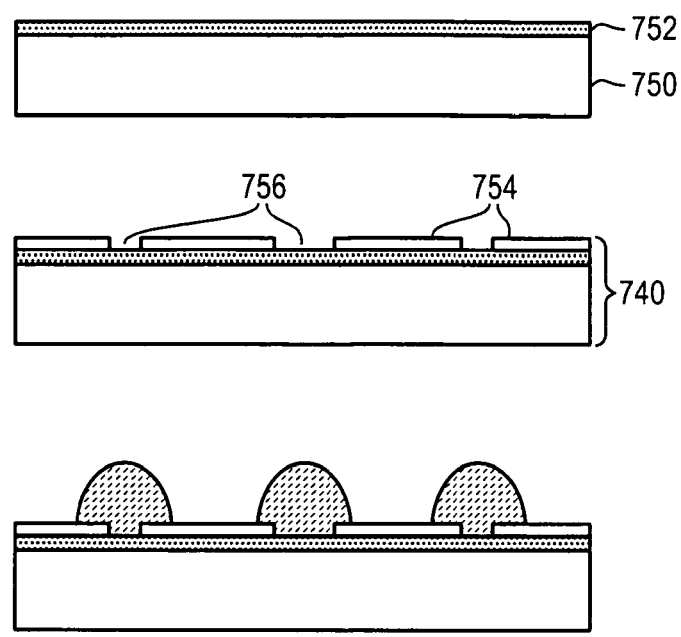
FIG. 7B is a schematic illustration of an exemplary copper electroplating process in accordance with the method of FIG. 7A, starting with blanket seed metal deposition, patterning of a low-temperature oxide, electroplating of copper on open areas of the seed metal, and expanding isotropically as the plating time is increased.
Figure 7C:
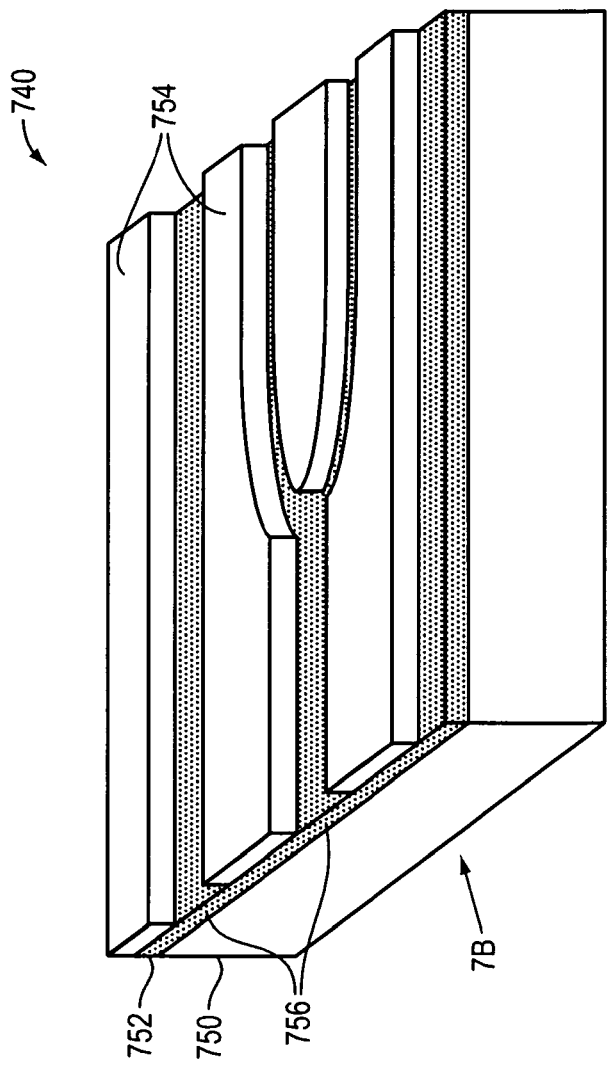
FIG. 7C is a perspective view of an exemplary structure fabricated according to the method of FIG. 7A.

An alternative method, which may reproducibly achieve nearly circular geometries, is an electroplating process known as a "buried electrode" process, depicted in FIGS. 7A-7C. In one embodiment, this process involves, in step 700, depositing a blanket metal layer, such as a chrome-gold layer (e.g., 500A Cr/1000A Au), on a silicon wafer by evaporation or sputtering. In step 702, an insulating layer (e.g., an oxide layer) may be deposited on top of the seed-metal, using, for instance, plasma-enhanced chemical vapor deposition (PECVD; Oxford System 100 PECVD Reactor). The thickness of the oxide layer may be in the range of approximately 0.5 to 1 μm. In one embodiment, the oxide is patterned, in steps 704 and 706, using a contact lithography system (Karl Suss MA-6) and Shipley 1822 photoresist (MF319 developer). This step may be followed, in step 708, by wet-etching of the oxide in hydrofluoric acid (Buffered Oxide Etch DI 1:7 HF) or by reactive ion etching. After the oxide is etched, the photoresist may be removed with a solvent (SVC-14) (step 710), making the wafer ready for metal electroplating (step 104).

An exemplary patterned structure 740, depicted in FIGS. 7B and 7C, includes, in this order, a substrate 750, a continuous electrically conducting layer 752, and electrically insulating regions 754. In regions 756 where the insulating layer has been etched, the conducting layer 752 is exposed. However, in contrast to the patterned gap structure 640 depicted in FIG. 6C, the metallic regions 752 in structure 740 are below the insulating regions 754. This feature eliminates delamination issues that may occur in the patterned gap process, and, consequently, alleviates the optimization of process parameters for the desired channel geometries.

In general, the shape and smoothness of the electroplated relief structures depend on the dimensions of the wafer pattern, as well as on various electroplating process parameters, including the electroplated material, the current density, the anode configuration, and the bath concentration and agitation. Nearly perfectly inverse circular geometries in master molds may be achieved in a commercial copper bath solution (e.g., Technic, Inc. Copper Bath RTU) without agitation at a current density in the range from 5.5 mA/cm$^2$ to 7.75 mA/cm$^2$. To obtain uniform current densities, an anode in spiral wire configuration may be employed. The resulting plating rate is about 14 μm/hour. Starting with feature widths of 50 μm in the patterned wafer, the height of the inverse channel portions approaches the width at a diameter of the inverse channel portion of about 200 μm. Using the ratio of the largest to the smallest diameter of realistic channels as a measure of the degree of circularity, ratios of less than 1.3 can be achieved. FIG. 3B, for example, shows a semicircular channel with a larger diameter of 199.1 μm and a smaller diameter of 176.8 μm, corresponding to a ratio of 1.12. Some embodiments may result in ratios of less than 1.1, or even of less than 1.03.

The buried electrode wafer depicted in FIG. 7C, while enabling substantially semicircular inverse channel portions, does not simultaneously provide for changes in the diameter. Since the seed metal layer 752 is continuous, the electroplated material deposits in all exposed regions at the approximately the same rate. Therefore, if the etched patterns were to include tapered features in order to vary the width of the inverse channel portions, the height of the inverse channel portions would not vary. Consequently, the cross sections of the inverse channel portions would not be semicircular throughout.

Figure 8A:
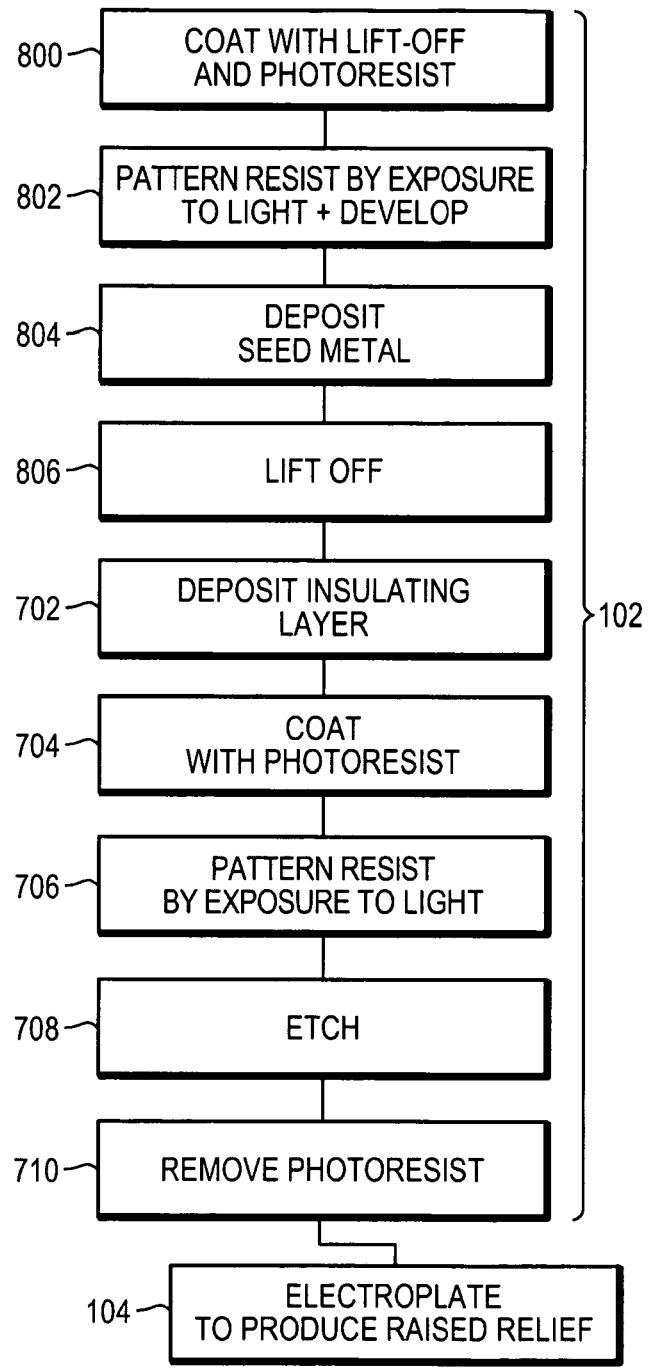
FIG. 8A is a flow diagram of a method for fabricating a master mold according to an electroplating process combining features of a patterned gap and a buried electrode process in accordance with one embodiment of the invention.
Figure 8B:
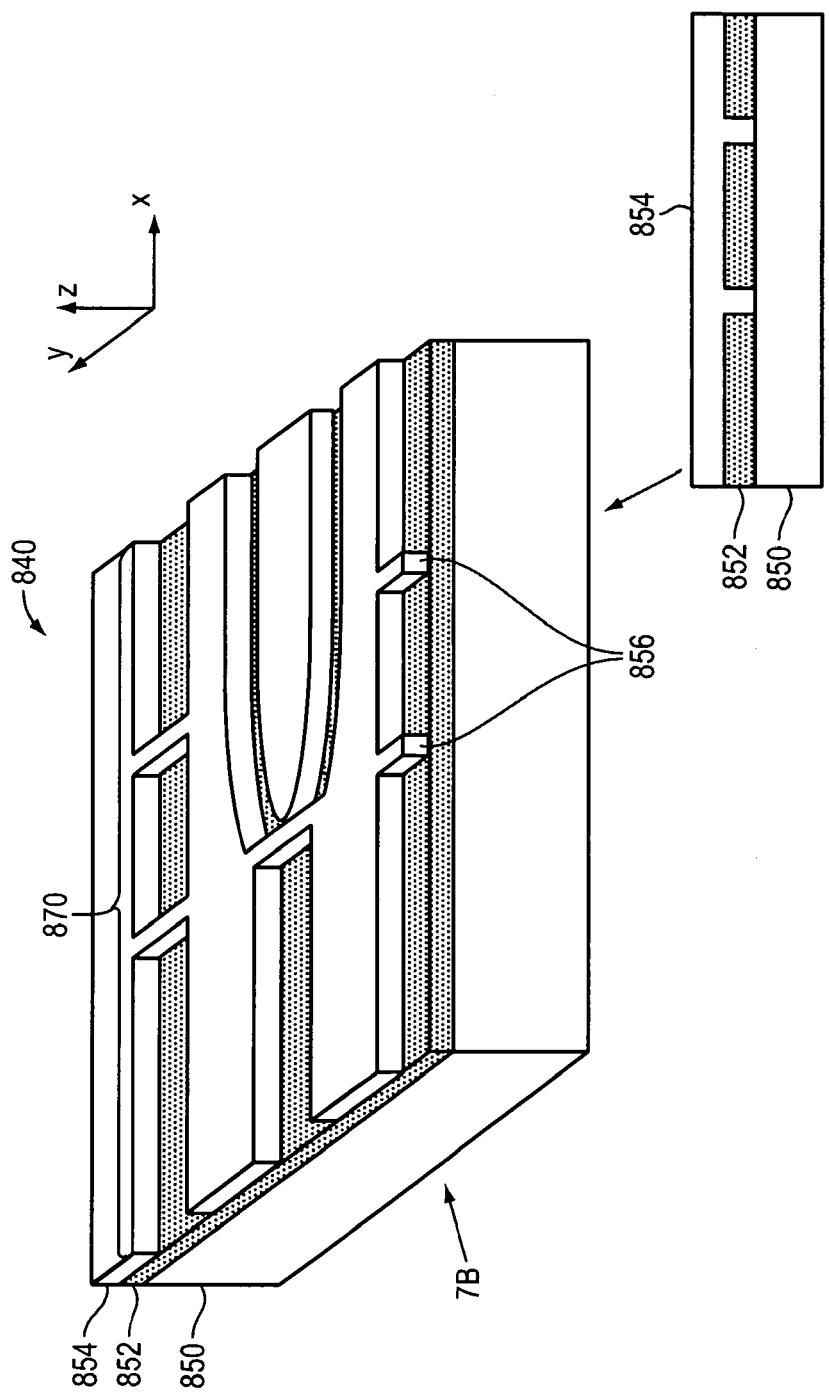
FIG. 8B is a perspective view of an exemplary structure fabricated according to the method of FIG. 8A.

In order to employ the buried electrode process and to achieve inverse channel portions with varying diameter, the advantageous properties of the buried electrode and the patterned gap process can be combined in a hybrid method illustrated in FIGS. 8A-8B. This method employs the patterning of both the seed metal and the insulating layers. In detail, as shown in FIG. 8A, the method involves, in a first step 800, coating a substrate (e.g., silicon) with lift-off resist and photoresist, and lithographically patterning it (similarly to steps 602 and 604 in FIG. 6A). Then, in step 802, the seed metal layer is deposited on the wafer by evaporation or sputtering (similarly to step 700 in FIG. 7A). In the subsequent lift-off step 804 (resembling step 610 of FIG. 6A), the metal is removed in an agitated solvent bath in certain areas where it is desired to change the channel diameter. The patterned wafer is subsequently coated with an insulating layer (step 702), such as silicon oxide, and with a photoresist layer (step 704), and patterned by means of lithography (step 706) and etching (step 708). After removal of the resist and cleaning of the wafer (step 710), the wafer is ready for electroplating (step 104).

Figure 8C:
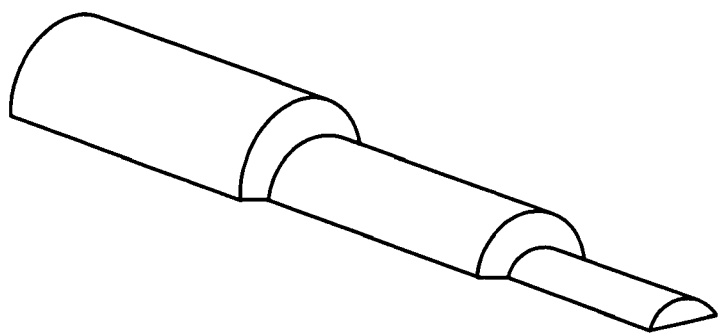
FIG. 8C is a perspective view of an exemplary electroplated channel fabricated from the structure shown in FIG. 8B.

An exemplary wafer 840, patterned according to the method shown in FIG. 8A, is depicted in FIG. 8B. It contains, in this order, a substrate 850, a seed metal layer 852, and an insulating layer 854. Along the axis of the channel structures (x-direction), the metal layer is patterned similarly to structure 640; along the perpendicular y-axis, the metal layer is continuous. Gaps 856 in the metal layer may be filled with insulating material. The discontinuity of the seed metal layer results in diameter changes of the raised structures produced by electroplating. The insulating layer 854 is patterned, in the y-direction, like that of the buried electrode wafer 740, and enables the fabrication of substantially semicircular channel portions. FIG. 8C illustrates the shape of an electroplated structure that results from the portion 870 of the patterned wafer 840.

B. Integrated Three-Dimensional Microfluidic Networks

Figure 9C:
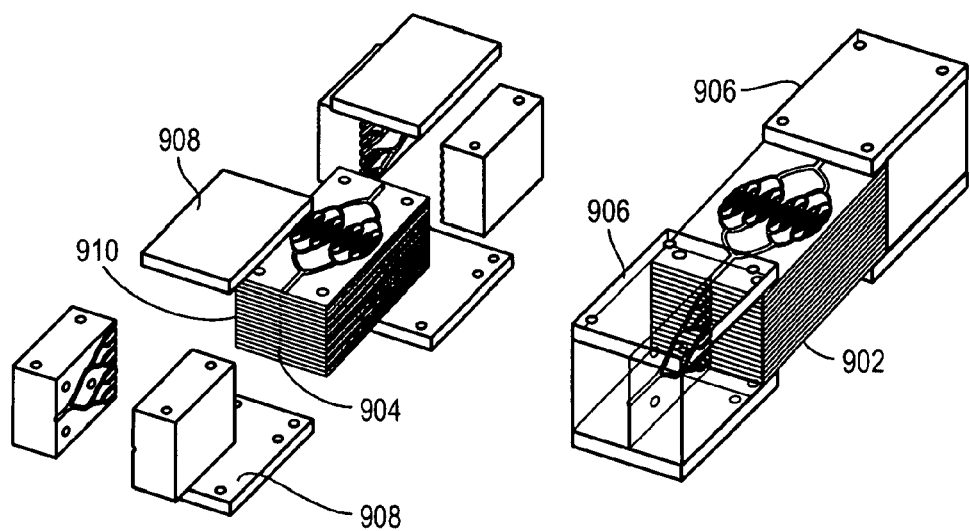
FIG. 9C illustrates an assembly of microfluidic devices, incorporating seven lateral flow layers with inlet and outlet headers, to form a three-dimensional integrated device in accordance with one embodiment of the invention.
Figure 9C:
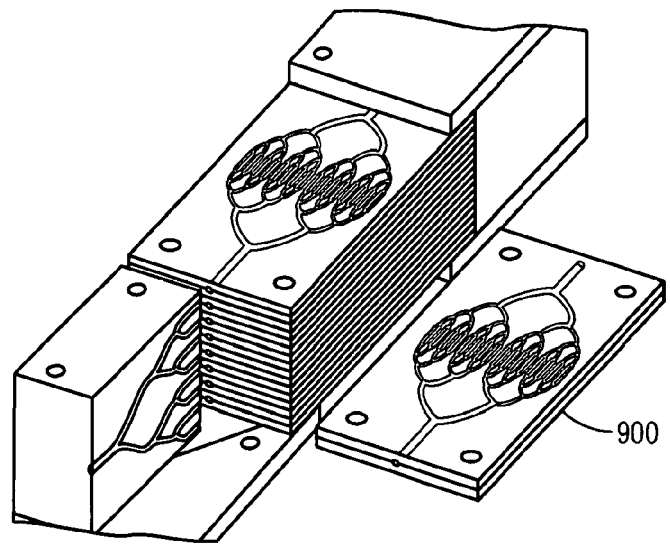

Microfluidic scaffolds having two layers of polymer sheets joined together typically form a two-dimensional flow network. In order to build a three-dimensional flow network, several such two-dimensional structures may be combined. For example, as illustrated in FIGS. 9A-9C, several individual microfluidic structures 900 may be stacked to form a stacked structure 902. The individual layers 900 of the stacked structure 902 may then be fluidically connected, e.g., with tubing fitted into the channel outlets 904. Alternatively, the structures 900 may be integrated into a three-dimensional flow network using a microfluidic header 906 with smooth, curved flow paths that distributes fluid evenly through the stacked structure 902.

The header 906 may be fabricated using stereolithography (SLA) technology, or employing the techniques described earlier. For example, FIG. 9A illustrates a header 906 containing two parts with corresponding half-channel flow networks, which may be produced by embossing electroplated reliefs into blocks of polystyrene as earlier described. To integrate the individual layers 900, they may be coupled (e.g., snapped) together and placed in direct contact with the inlet and outlet headers 906, as depicted in FIG. 9B. Top and bottom plates 908 may be used to arrest the relative positions of headers 906 and stacked structure 902.

In one embodiment, the microchannel flow network of the headers 906 is rotated with respect to the flow networks in the stacked structure 902, and aligned with the outlets 904 in a front surface 910 of the stacked structure 902 that arises from a flush arrangement of the layers 900. If the outlets 904 are placed along a straight line, as depicted, the header 906 need only contain a single channel flow network. Generally, structures 902 may contain different channel flow networks, whose outlets form a two-dimensional pattern in the front surface 908. Fluidic connections between the layers 900 may then be achieved with a header 906 that comprises several layers with microchannel networks itself.

A photograph of an exemplary assembly of a three-dimensional flow network is shown in FIG. 9C, with a single closed two-dimensional flow network (i.e., two half-channel layers fitted together) placed to the right-hand side for illustrative purposes. In this assembly, the header channels bifurcate with smooth flow paths in a vertical manner to connect to each of the seven two-dimensional flow layers.

C. Biomedical Applications

Establishment of a robust functional phenotype for endothelial cells in three-dimensional microfluidic constructs typically requires exquisite control over numerous parameters associated with the cell microenvironment. Among these are surface chemical interactions between the cultured endothelial layer and the walls of the scaffold, and the stability of the surface over time. In addition, the mechanical forces present must be well-controlled and stable over time and as a function of cell seeding and local flow conditions.

As described herein, microfluidic devices according to various embodiments provide microchannels with smooth walls, substantially circular cross sections, and gradually varying diameters. The combination of these features results in smooth transitions at bifurcations. By contrast, bifurcations of channels with rectangular cross sections typically result either in a change of the channel aspect ratio, i.e., the ratio of channel width to channel height, or, if the area of the channel cross section changes at the bifurcation while the aspect ratio remains constant, in abrupt changes in channel height. Both changes in the aspect ratio and the sharp corners associated with abrupt changes in channel dimension typically result in flow turbulences. Devices manufactured in accordance with certain embodiments of the present invention, on the other hand, feature smooth flow paths and, as a result, well-controlled forces, throughout the entirety of the channel network.

Figure 10:
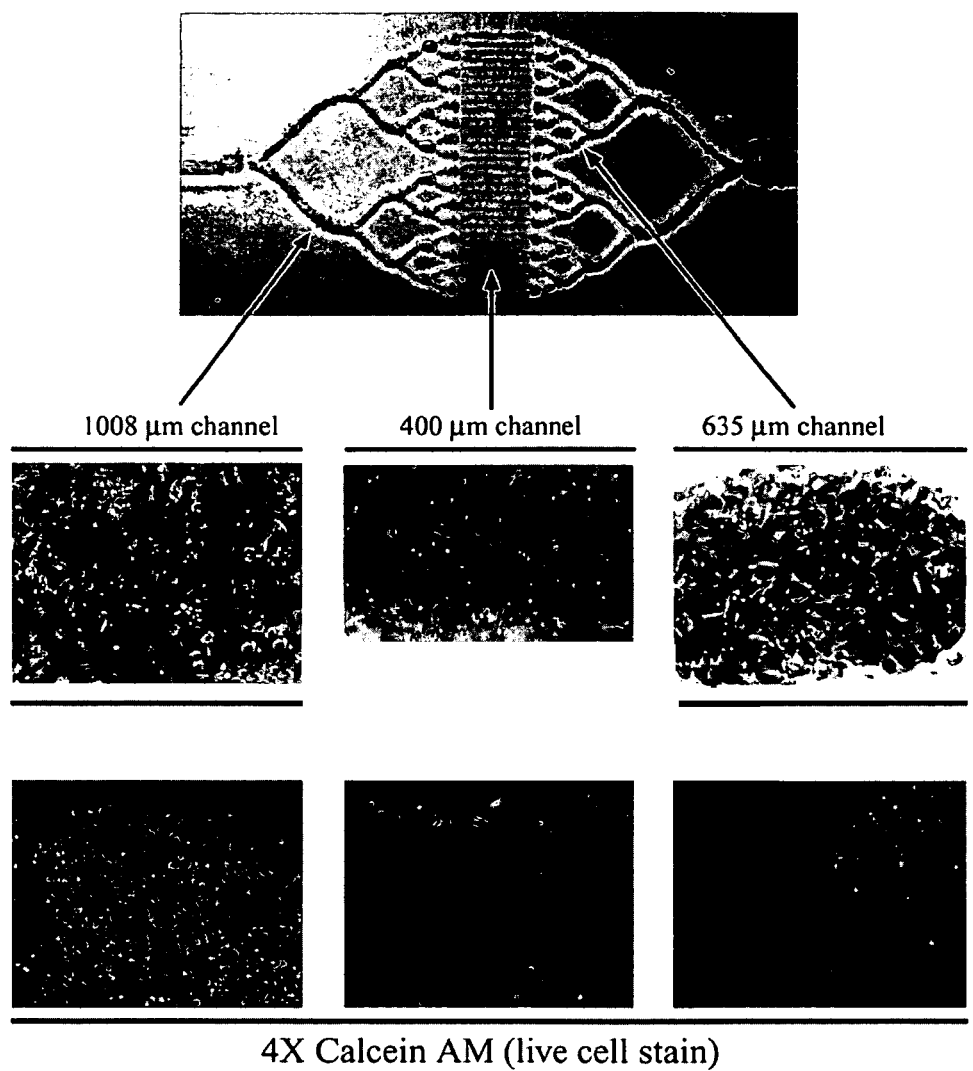
FIG. 10 is a diagram illustrating cell adhesion, monolayer formation, and cell viability for primary human umbilical vein endothelial cells (HUVEC) seeded in a polystyrene network.

Chemical interactions between endothelial cells and the channels influence the ability of the cells to attach as a confluent monolayer to the network channel walls and maintain viability under normal culture conditions. As depicted in FIG. 10, cell attachment and monolayer formation within polystyrene networks micromolded from stereolithographic masters has been achieved, and is best visualized using phase contrast imaging. Cell viability has been confirmed using a calcein AM live cell stain in which only viable cells fluoresce. In some embodiments, both cell attachment/monolayer formation and viability are consistent among channels and independent of the channel diameter. Overall, these results show that primary HUVEC attach and form a confluent monolayer within three-dimensional networks, and remain viable after 24 hours of culture, validating the fabrication approach described above for generating three-dimensional microfluidic devices for microvascular network applications.

Figure 11:
FIG. 11 illustrates a calcein-AM live cell stain of primary HUVEC 18 hours after seeding in open channels (200 μm diameter) using an electroplating fabrication technique.

Open polystyrene half-channels having diameters of about 200 µm, generated with the above-described electroplating fabrication approach, may be plated for 18 hours with HUVEC and assessed for monolayer formation and cell viability. As shown in FIG. 11, primary HUVEC formed an intact monolayer and stained with calcein AM (a marker of cell viability), thus validating the compatibility of the electroplating fabrication process proposed above with endothelial cell culture.

Several advantages to the approaches described herein include the ability to produce vascular networks having vessels with substantially cylindrical geometries, and to construct smooth transitions at vessel bifurcations and vessel diameter changes in a manner similar to healthy physiologic structures. Once such a healthy physiologic structure has been manufactured as described herein, a specific geometry associated with disease or pathology may be introduced into a single one of the vessels and studied in isolation. For example, a rectangular geometry, a sharp angle or bend, a dead space, and/or a sudden expansion or contraction at a vessel bifurcation or at a dimensional change in the vessel may be introduced therein to approximate an atherosclerotic or other cardiovascular condition. In such a fashion, a disturbed flow condition associated with, for example, thrombus formation, plaque formation, or an inflammatory response may be studied in isolation and in a controlled fashion at that single diseased or pathologic structure.

Having described certain embodiments of the invention, it will be apparent to those of ordinary skill in the art that other embodiments incorporating the concepts disclosed herein may be used without departing from the spirit and scope of the invention. For example, the electroplating methods described may also be applied to the optimization of inverse channel geometries with non-semicircular cross sections. Accordingly, the described embodiments are to be considered in all respects as only illustrative and not restrictive.

What is claimed is:

1. A microfluidic structure for biomedical applications, comprising:
    a polymer scaffold, suitable for biomedical applications, defining a shape of a first microfluidic channel therein, at least a portion of the first microfluidic channel being characterized by a substantially circular cross section and a gradually changing diameter over a length thereof, wherein for any first diameter of the first microfluidic channel and any second diameter of the first microfluidic channel intersecting the first diameter, where the first diameter is greater than the second diameter, the ratio of the first diameter to the second diameter is between 1.0 and 1.3;
    wherein the first microfluidic channel bifurcates into at least a second microfluidic channel and a third microfluidic channel, and a diameter of the first microfluidic channel smoothly and gradually transitions to a diameter of the second microfluidic channel and a diameter of the first microfluidic channel smoothly and gradually transitions to a diameter of the third microfluidic channel.

2. The microfluidic structure of claim 1 further comprising cells seeded within the first channel.

3. The microfluidic structure of claim 1 wherein, the portion of the first channel being characterized by a substantially circular cross section has a diameter between about 5 micrometers and about 300 micrometers.

4. The microfluidic structure of claim 1 wherein, the portion of the first channel being characterized by a substantially circular cross section has a diameter between about 300 micrometers and 2 mm.

5. The microfluidic structure of claim 1, wherein the polymer scaffold comprises a first sheet defining a first portion of the first channel therein and a second sheet defining a second portion of the first channel therein.

6. The microfluidic structure of claim 5, wherein the first portion of the first channel and the second portion of the first channel are each characterized by a substantially semicircular cross section.

7. The microfluidic structure of claim 5, wherein the second sheet is a mirror image of the first sheet.

* * * * *